United States Patent
Sugita et al.

(10) Patent No.: US 11,109,520 B2
(45) Date of Patent: Aug. 31, 2021

(54) ROTARY HEAD TYPE COMPONENT MOUNTER

(71) Applicant: FUJI CORPORATION, Chiryu (JP)

(72) Inventors: Hiroyoshi Sugita, Chiryu (JP);
Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/824,279

(22) Filed: Mar. 19, 2020

(65) Prior Publication Data
US 2020/0221614 A1 Jul. 9, 2020

Related U.S. Application Data

(63) Continuation of application No. 15/739,887, filed as application No. PCT/JP2015/070037 on Jul. 13, 2015, now Pat. No. 10,667,449.

(51) Int. Cl.
*B23P 19/00* (2006.01)
*H05K 13/04* (2006.01)
*H05K 13/08* (2006.01)
*G06T 7/73* (2017.01)

(52) U.S. Cl.
CPC .......... *H05K 13/0413* (2013.01); *G06T 7/73* (2017.01); *H05K 13/041* (2018.08); *H05K 13/0408* (2013.01); *H05K 13/0409* (2018.08); *H05K 13/089* (2018.08); *Y10T 29/53191* (2015.01)

(58) Field of Classification Search
CPC ............. H05K 13/041; H05K 13/0408; H05K 13/0409; H05K 13/0413; H05K 13/0404; Y10T 29/53191; B25J 15/04; B65G 47/914

USPC ......... 29/743, 428, 705, 707, 739, 740, 760, 29/832, 834, 836
See application file for complete search history.

(56) References Cited

U.S. PATENT DOCUMENTS 7,603,766 B2  10/2009  Kawada
9,452,897 B2   9/2016  Nishiyama
9,642,295 B2 *  5/2017  Teshima ................... B25J 9/026
(Continued)

FOREIGN PATENT DOCUMENTS

JP    2003-347796 A    12/2003

OTHER PUBLICATIONS

International Search Report dated Oct. 13, 2015 in PCT/JP2015/070037 filed Jul. 13, 2015.

*Primary Examiner* — Thiem D Phan
(74) *Attorney, Agent, or Firm* — Oblon, McClelland, Maier & Neustadt, L.L.P.

(57) ABSTRACT

In a rotary head type component mounter, among a specified quantity of suction nozzles held by a rotary head, multiple suction nozzles are lowered simultaneously. When the rotary head is moved by a head moving mechanism to a nozzle exchange area and exchange of suction nozzles is performed, two station reference marks of the nozzle station are imaged by a mark imaging camera, image recognition is performed of the positions of the two station reference marks, and the position and angle of the nozzle station is calculated. Then, the position and angle of the rotary head is corrected to be aligned with the position and angle of the nozzle station, multiple of the suction nozzles held on the rotary head are lowered simultaneously by Z-axis driving mechanisms and simultaneously exchanged with multiple of the suction nozzles in the nozzle station.

1 Claim, 10 Drawing Sheets

(56) References Cited

U.S. PATENT DOCUMENTS 10,506,749 B2 * 12/2019 Kawaguchi ............ H05K 13/08
2015/0237773 A1 8/2015 Nishiyama

* cited by examiner

ROTARY HEAD TYPE COMPONENT MOUNTER

CROSS REFERENCE TO RELATED APPLICATIONS

This application is a continuation of U.S. patent application Ser. No. 15/739,887, filed Dec. 26, 2017, which is a National Stage Entry of PCT Patent Application No. PCT/JP2015/070037 filed Jul. 13, 2015, the entire contents of which are incorporated herein by reference.

TECHNICAL FIELD

The present application relates to a rotary head type component mounter configured to automatically exchange a suction nozzle held by a rotary head (rotating type mounting head) and a suction nozzle loaded in a nozzle station.

BACKGROUND ART

In a rotary head type component mounter, as disclosed in patent literature 1 (JP-A-2003-347796), exchange-use suction nozzles are loaded in a nozzle station (nozzle changer) that is set in the component mounter, and automatic exchange is performed of a suction nozzle held on a rotary head and a suction nozzle in the nozzle station. Further, with the rotary head type component mounter disclosed in patent literature 1, six nozzle holders (work heads) are provided to be raisable and lowerable on the rotary head (work section), and a suction nozzle is exchangeably held by each of the nozzle holders, and to shorten exchange time for suction nozzles, the arrangement pitch of suction nozzles in the nozzle holders is the same as the arrangement pitch of suction nozzles in the nozzle station, such that, when exchanging suction nozzles, two nozzle holders can be lowered simultaneously above the nozzle station to exchange two suction nozzles at the same time.

CITATION LIST

Patent Literature

Patent literature 1: JP-A-2003-347796

SUMMARY

Technical Problem

However, there is variance in the position of the nozzle station inside the component mounter due to attachment tolerances and the like, and there is a possibility that the nozzle station is attached at an angle with respect to the reference coordinates (XY coordinates) of the component mounter, such that the position of a suction nozzle in the nozzle station is deviated from its expected position. Thus, when exchanging suction nozzles, if the rotary head is positioned above the nozzle station at the reference coordinates (XY coordinates) and two nozzle holders are lowered simultaneously, suction nozzle exchange may fail due to position deviation of a suction nozzle in the nozzle station.

Thus, to solve the above problems, an object of the present disclosure is to provide a rotary head type component mounter for which simultaneous exchange of multiple suction nozzles held by a rotary head and multiple suction nozzles in a nozzle station is possible even in a case in which the nozzle station is attached at an angle with position deviation.

Solution to Problem

To solve the above problems, the present disclosure is a rotary head type component mounter, including: a rotary head configured to hold a specified quantity of suction nozzles in an exchangeable manner at a specified nozzle pitch in a circumferential direction; a nozzle station configured such that multiple suction nozzles are arranged to be exchanged with a suction nozzle held by the rotary head; a head rotating mechanism configured to revolve the specified quantity of suction nozzles in a rotation direction of the rotary head by rotating the rotary head; a head moving mechanism configured to move the rotary head in XY directions to and from a component pickup area at which component pickup operation is performed, a component mounting area at which component mounting operation is performed, and a nozzle exchange area at which exchange operation of suction nozzles is performed; a Z-axis driving mechanism configured to drive raise and lower the suction nozzle in the component pickup area, the component mounting area, and the nozzle exchange area so as to perform component pickup, component mounting, and exchange of the suction nozzle; a control means configured to perform control of the head rotating mechanism, the head moving mechanism, and the Z-axis driving mechanism; and a station position and angle detecting means configured to detect a position and angle of the nozzle station, wherein the Z-axis driving mechanism is configured to simultaneously lower multiple suction nozzles of the specified quantity of suction nozzles held by the rotary head, and the control means is configured to, when the head moving mechanism moves the rotary head to the nozzle exchange area for exchange of suction nozzles to be performed, correct the position of the rotary head moved by the head moving mechanism based on a position of the nozzle station detected by the station position and angle detecting means, correct the rotation angle of the rotary head rotated by the head rotating mechanism to be aligned with the angle of the nozzle station detected by the station position and angle detecting means, and cause the Z-axis driving mechanism to simultaneously lower multiple of the suction nozzles held by the rotary head and perform simultaneous exchange with multiple of the suction nozzles in the nozzle station.

According to this configuration, because the position and angle of the nozzle station are detected and the position and angle of the rotary head are corrected in accordance with the detection results when performing simultaneous exchange of suction nozzles, even in a case in which the nozzle station is attached at an angle with a position deviation, it is possible to perform simultaneous exchange of multiple suction nozzles held by the rotary head with multiple suction nozzles in the nozzle station.

Note that, because work of changing the positions of suction nozzles in a nozzle station is manual work performed by an operator, having an exchangeable nozzle station enables work of changing the positions of suction nozzles in the nozzle station to be performed without time pressure in a spacious area outside of the component mounter while the component mounter continues to operate, and is convenient because preparation can be done for exchange of the next nozzle station. However, if the nozzle station is configured to be exchangeable, it is easier for the angle or position of the nozzle station set inside the component mounter to deviate, therefore the present disclosure is particularly effective in this case.

In this case, the configuration may be such that a station reference mark is provided on an upper surface of the nozzle station at at least two locations, further provided is a mark imaging camera configured to move in the XY directions as one body with the rotary head via the head moving mechanism, wherein the station position and angle detecting means, by imaging the at least two station reference marks provided on the nozzle station using the mark imaging camera and performing image recognition of a position of the at least two station reference marks, detects the position and angle of the nozzle station based on the positions of the at least two station reference marks. Accordingly, the mark imaging camera equipped on the component mounter for imaging board marks of a circuit board can be used, and the position and the angle of the nozzle station can be detected using image processing.

Further, the present disclosure may be configured wherein a head reference mark is provided at at least two locations on an underside of the rotary head, further provided is a component imaging camera configured to image a component held by the suction nozzle from below, and a head position and angle detecting means configured to, by imaging the at least two head reference marks provided on the rotary head using the component imaging camera and performing image recognition of a position of the at least two head reference marks, detect a position and angle of the rotary head based on the position of the at least two head reference marks, wherein the control means calculates a position correction amount and angle correction amount of the rotary head based on the position and angle of the rotary head detected by the head position and angle detecting means, and the position and angle of the nozzle station detected by the station position and angle detecting means and then performs simultaneous exchange of multiple suction nozzles. Accordingly, because the position and angle of the rotary head can be detected, it is possible to accurately determine the position correction amount and the angle correction amount of the rotary head, and even if the position and angle of the rotary head is deviated, the deviation can be corrected, and multiple suction nozzles held by the rotary head and multiple suction nozzles in the nozzle station can be exchanged simultaneously. Further, the component imaging camera equipped on the component mounter can be used, and the position and angle of the rotary head can be detected using image processing.

Also, the suction nozzles may be arranged in the nozzle station such that a movement distance of the rotary head from a position of the suction nozzles exchanged simultaneously previously to a position of the suction nozzles exchanged simultaneously subsequently is minimized. Thus, suction nozzle exchange time can be further reduced.

Further, the present disclosure may be configured wherein a nozzle ID recording section on which is memorized or recorded identification information (hereinafter referred to as "nozzle ID") of the suction nozzle is provided on the suction nozzle, further provided is a nozzle ID reading means configured to read the nozzle ID from the nozzle ID recording section, wherein the control means is configured to, in a case in which it is determined that an arrangement order of the suction nozzles in the nozzle station is different to an exchange order based on the nozzle IDs read by the nozzle ID reading means from the nozzle ID recording sections of each of the suction nozzles arranged in the nozzle station, change the arrangement order of the suction nozzles in the nozzle station using exchange operation of the suction nozzles so as to match the exchange order. Thus, in a case in which the arrangement order of suction nozzles in the nozzle station is different to the exchange order, the arrangement order of the suction nozzles in the nozzle station can be changed to match the exchange order.

Here, when a code label with a barcode or 2D code that records the nozzle ID is used as a nozzle ID recording section, the mark imaging camera may be used as the nozzle ID reading means.

DESCRIPTION OF EMBODIMENTS

Figure 1:
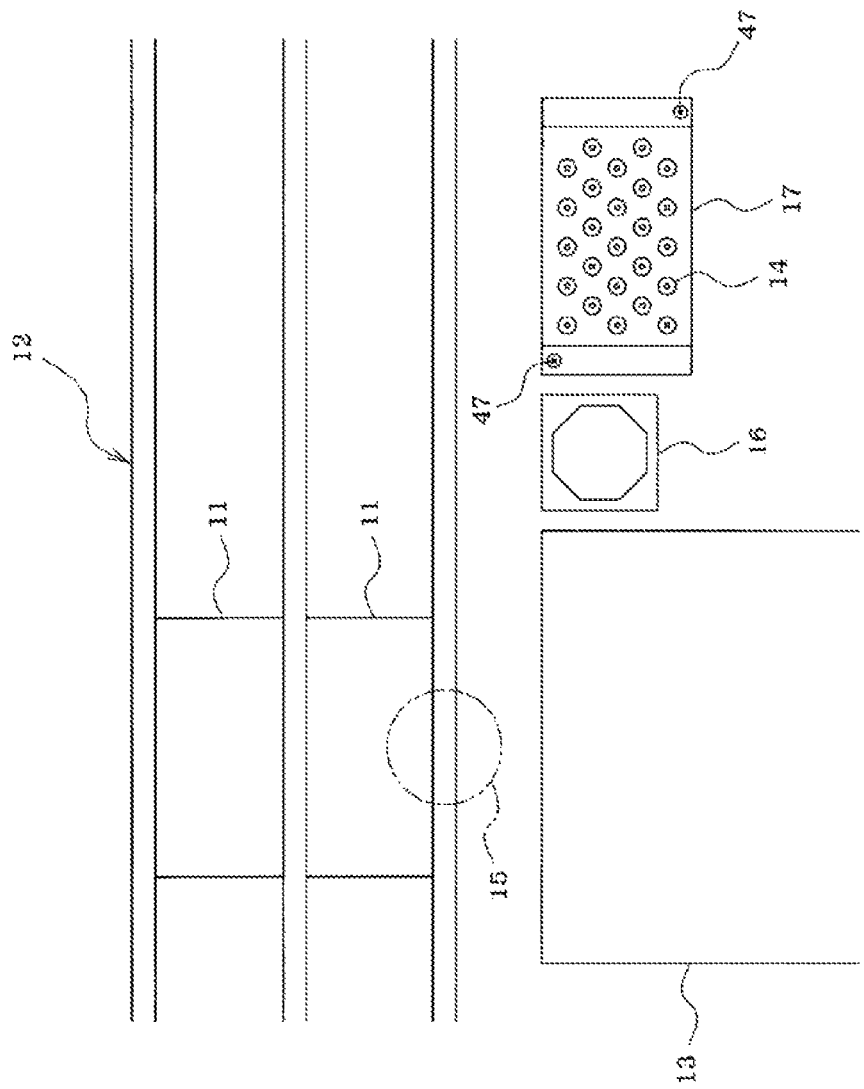
FIG. 1 is plan view of the main components of a rotary head type component mounter that is an embodiment of the present disclosure.

An embodiment of the disclosure is described below. First, the configuration of a rotary head type component mounter is described based on FIGS. 1 and 2.

The rotary head type component mounter is configured from items such as conveyor 12 that conveys circuit board 11, component supply device 13 such as a tape feeder or tray feeder, rotary head 15 that picks up components supplied by component supply device 13 using suction nozzles 14 (refer to FIGS. 3 to 5) and mounts the components on circuit board 11, component imaging camera 16 that images a component held by suction nozzle 14 from below, and nozzle station 17 in which multiple suction nozzles 14 are arranged for exchange with suction nozzles 14 held by rotary head 15. As shown in FIG. 6, multiple nozzle housing recesses 18 for housing suction nozzles 14 are formed in multiple rows at a regular pitch in nozzle station 17.

Provided in the component mounter is head moving mechanism 20 (refer to FIG. 2) that moves rotary head 15 in XY directions to and from a component mounting area at which component pickup operation is performed, a component imaging area at which components held by suction nozzles 14 are imaged using component imaging camera 16, a component mounting area at which component mounting operation is performed, and a nozzle exchange area at which exchange operation of suction nozzles 14 is performed.

Figure 2:
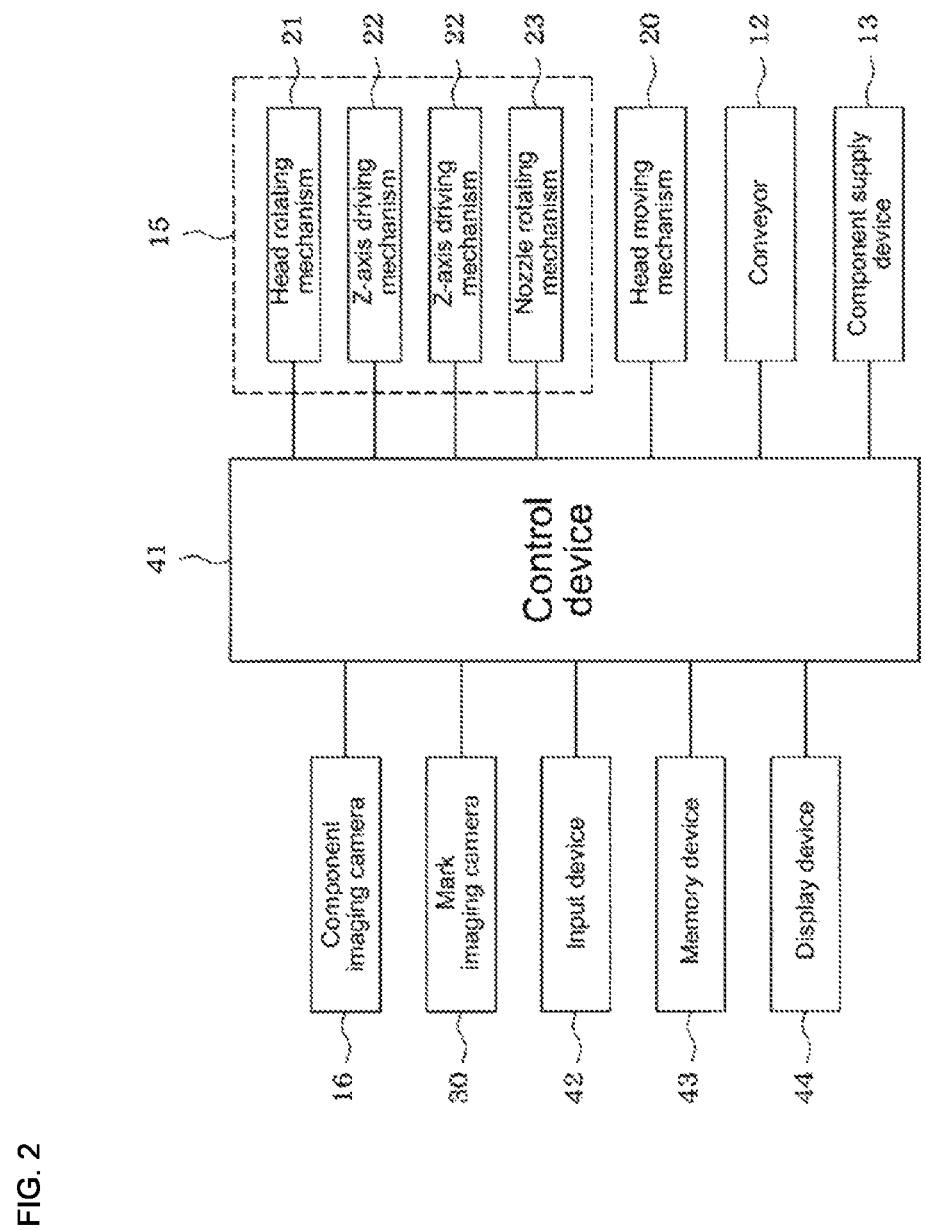
FIG. 2 is a block diagram showing the configuration of control items of the component mounter.
Figure 3:
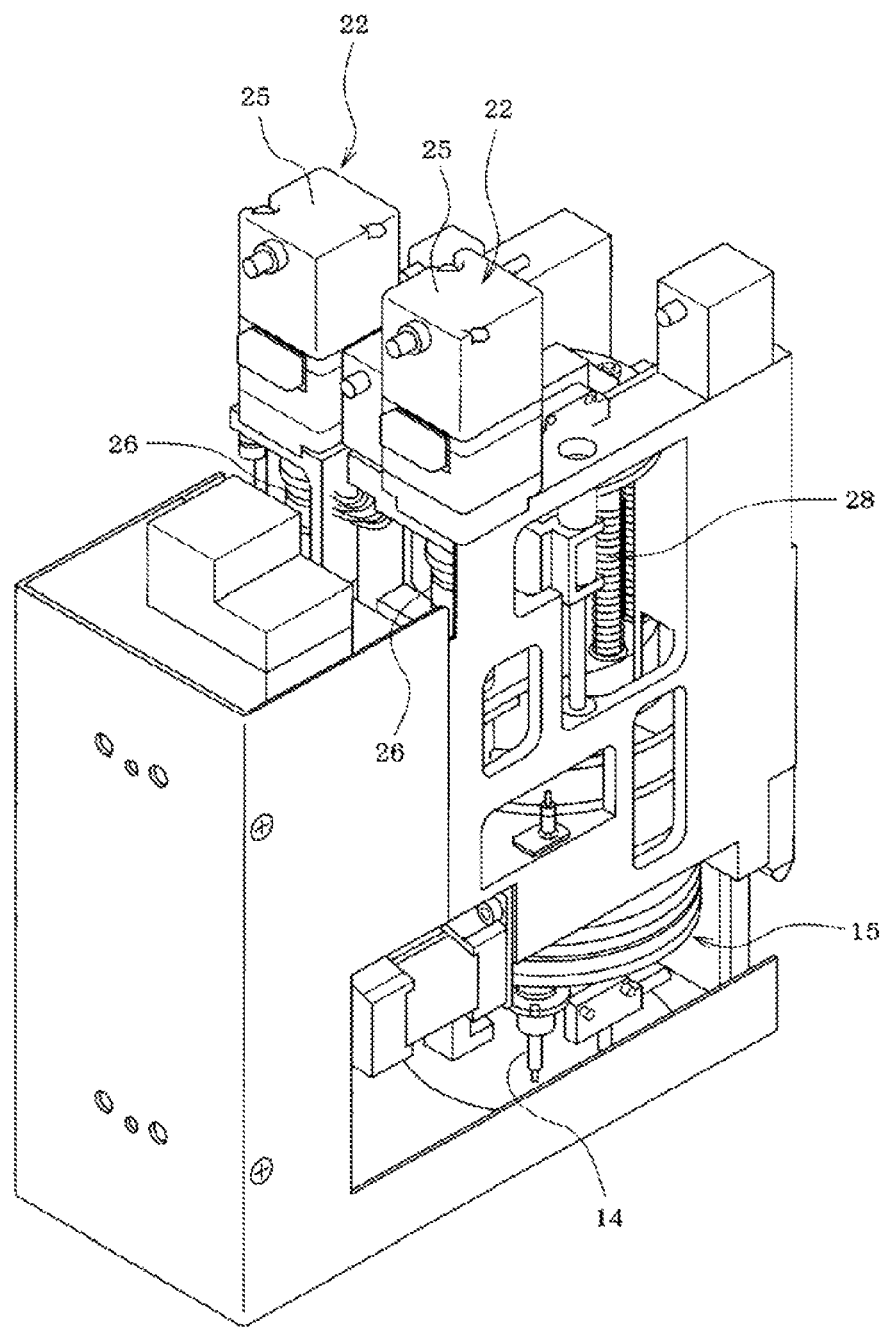
FIG. 3 is an overall perspective view seen from diagonally above of a rotary head.
Figure 4:
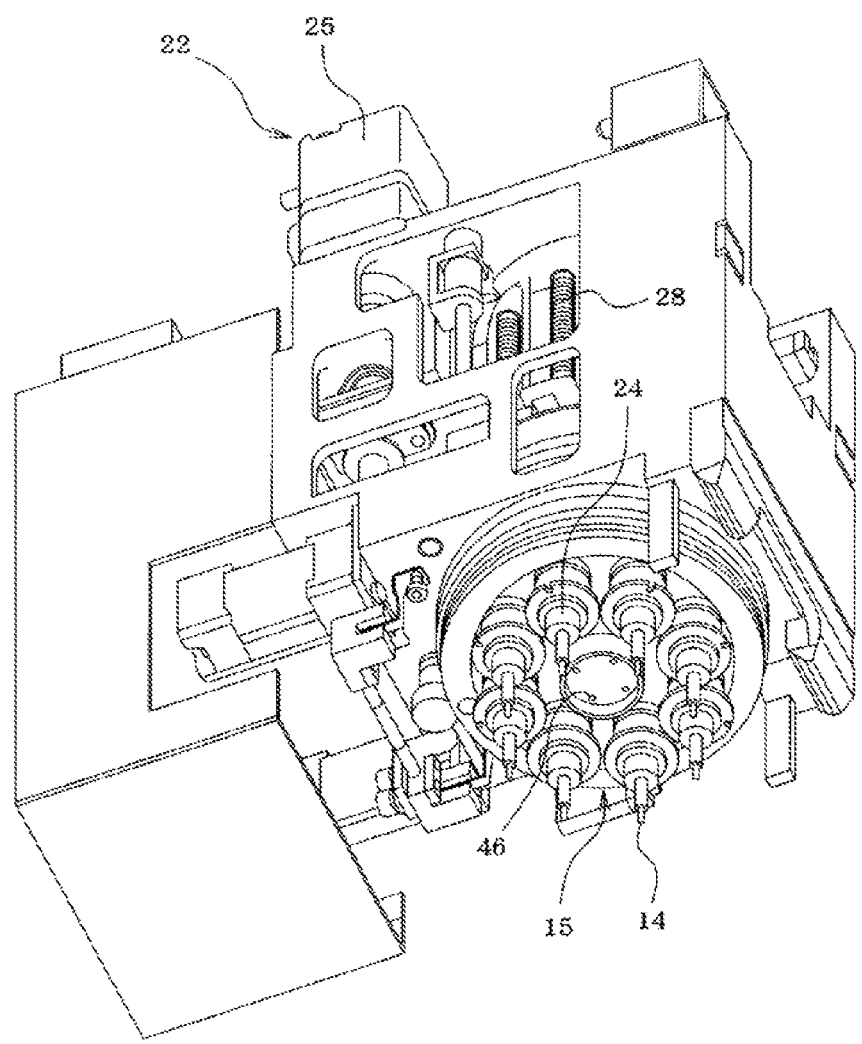
FIG. 4 is an overall perspective view seen from diagonally below of the rotary head.

As shown in FIGS. 3 and 4, a specified quantity of suction nozzles 14 are exchangeably provided on rotary head 15 at a specified nozzle pitch in a circumferential direction, suction nozzles 14 being configured to pick up components fed to a component pickup position by component supply device 13. Further, as shown in FIG. 2, rotary head 15 is provided with head rotating mechanism 21 that revolves the multiple suction nozzles 14 in a circumferential direction of rotary head 15 by rotating (on its own axis) rotary head 15 around its own central axis (R axis), Z-axis driving mechanism 22 that causes suction nozzle 14 to pick up a component by lowering the suction nozzle 14 at a specified stopping position (above the component pickup position) on the revolution path of suction nozzles 14, and nozzle rotating mechanism 23 that corrects the direction of a component picked up by suction nozzle 14 by rotating (on its own axis) suction nozzle 14 around its own center axis.

In the present embodiment, Z-axis driving mechanism 22 is provided at two locations around rotary head 15, and two suction nozzles 14 are lowered simultaneously at these two locations by Z-axis driving mechanism 22 such that components are picked up by the two suction nozzles 14 simultaneously, or such that two suction nozzles 14 in nozzle station 17 can be exchanged simultaneously.

As shown in FIGS. 3 and 4, each Z-axis driving mechanism 22 uses Z-axis motor 25 as an actuator, and by screw 26 being rotated by this Z-axis motor 25 such that a Z-axis slide (not shown) is moved up and down, the Z-axis slide engages with an engaging member (not shown) provided at the top end of nozzle holder 28 of rotary head 15, which raises and lowers nozzle holder 28, thus raising and lowering suction nozzle 14 held on the lower section of nozzle holder 28. In addition, the Z-axis slide may be moved in the vertical direction by using a linear motor as Z-axis motor 25. Alternatively, instead of a linear motor, a linear solenoid, an air cylinder, or the like may be used.

Mark imaging camera 30 (refer to FIG. 2) for imaging reference marks of circuit board 11 from above is provided on the component mounter and moves together with rotary head 15 via head moving mechanism 20.

Connected to control device 41 (control means) of the component mounter are, for example, input device 42 such as a keyboard, mouse, or touchscreen panel; memory device 43 (memory means) including a hard disk, RAM, ROM and so on for memorizing various types of programs, data, and the like; and display device 44 such as a liquid crystal display or CRT.

During operation of the component mounter, operation is repeated such that, after component pickup operation has been completed by moving rotary head 15 to the component pickup area using head moving mechanism 20, rotary head 15 is moved to the component imaging area, the component held by suction nozzle 14 is imaged from below using component imaging camera 16, the pickup orientation, and pickup position and angle deviation amount is recognized, and then rotary head 15 is moved to the component mounting area and component mounting operation of mounting the component on circuit board 11 is performed after correcting the pickup position and angle deviation. In the component pickup area, operation is repeated in which, after two suction nozzles 14 positioned above the component pickup positions are simultaneously lowered and two components are simultaneously picked up by the two suction nozzles 14, the two suction nozzles 14 are raised to their original positions, such that the specified quantity of suction nozzles 14 held on nozzle holders 28 of rotary head 15 pick up components sequentially.

Figure 5:
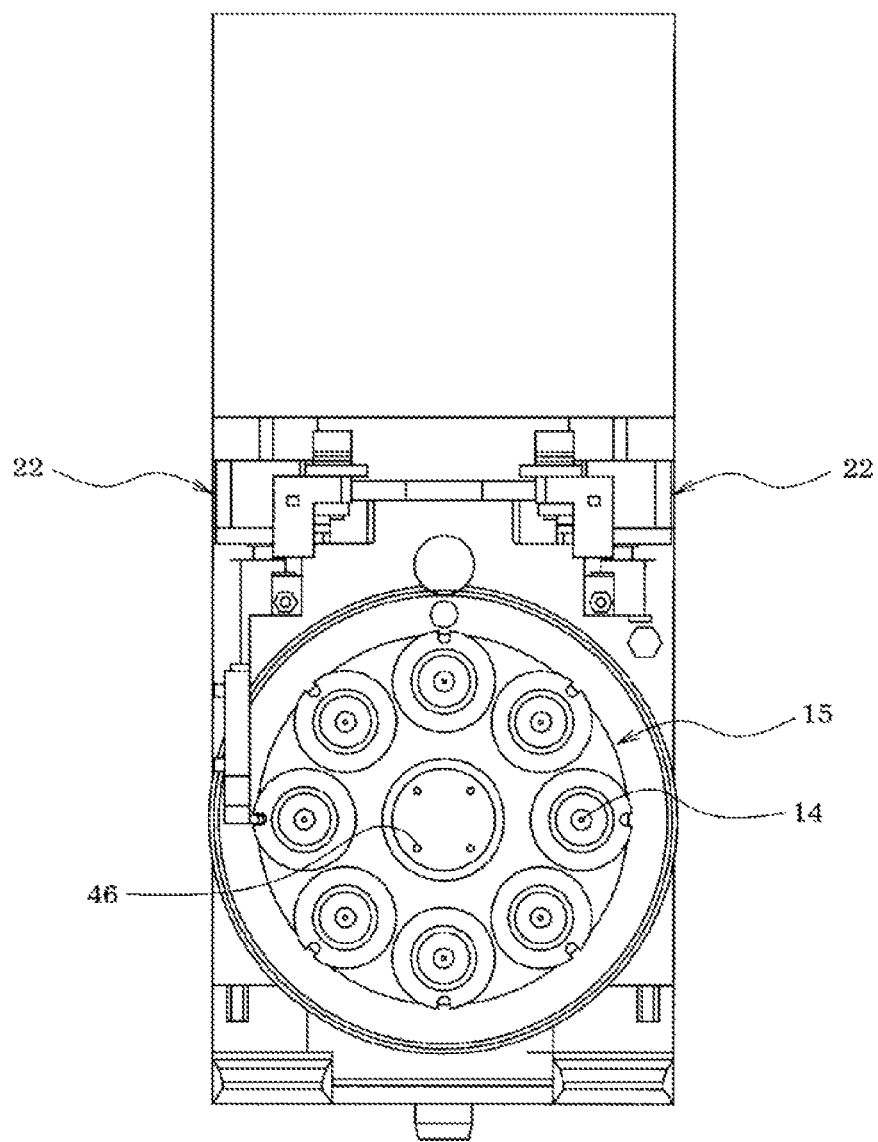
FIG. 5 is a bottom view of the rotary head.
Figure 6:
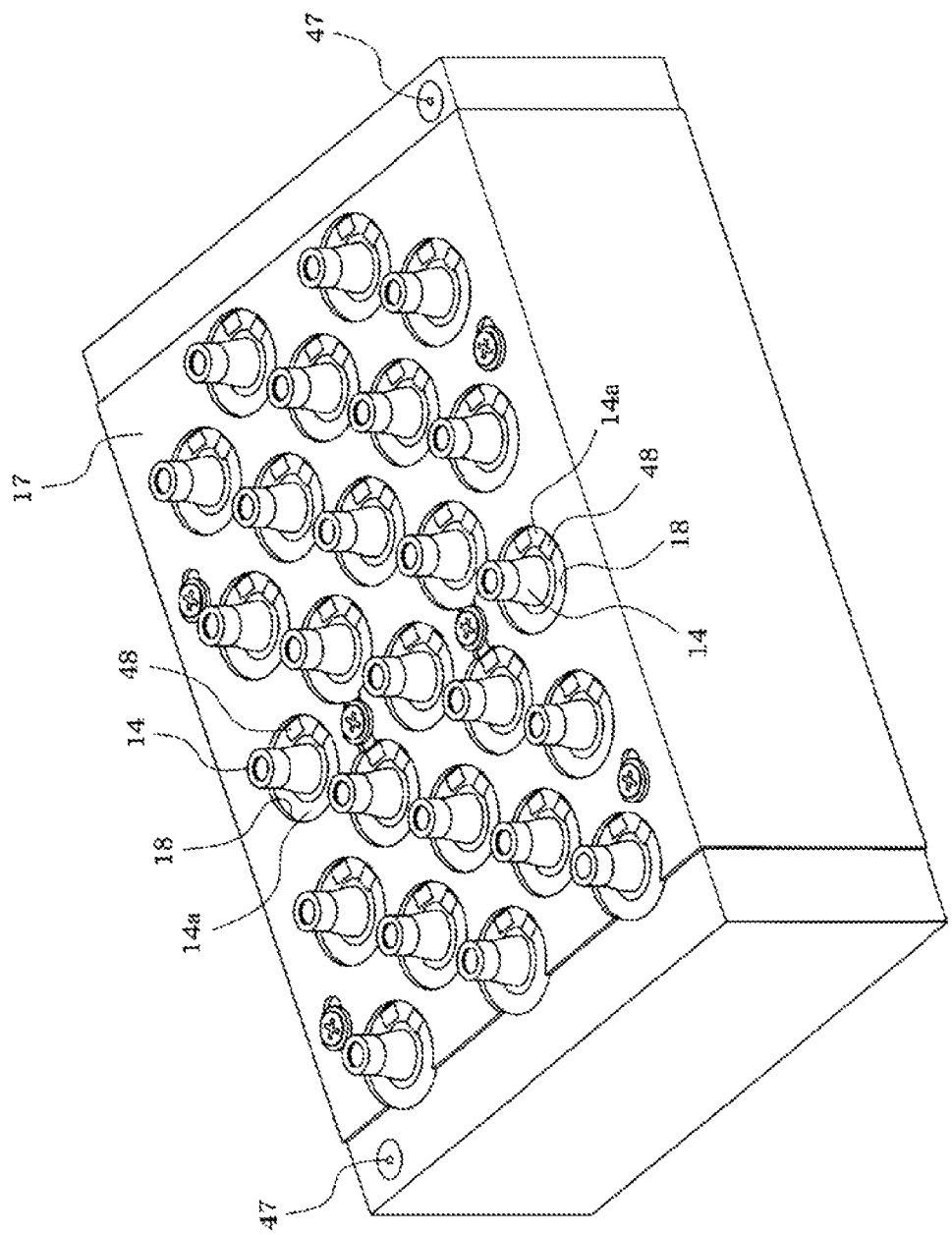
FIG. 6 is a perspective view of a nozzle station.

As shown in FIGS. 4 and 5, on a lower surface of rotary head 15, head reference marks 46 are provided at four locations (or at least two locations) at equal intervals with the rotational axis of rotary head 15 at the center. Control device 41 of the component mounter functions as the head position and angle detecting means that detects the position (XY coordinates of a central point) and angle (θ) of rotary head 15 based on the positions of the four head reference marks 46 by imaging the four head reference marks 46 on the lower side of rotary head 15 using component imaging camera 16 and performing image recognition of the positions of the four head reference marks 46. Accordingly, because the position and angle deviation of rotary head 17 can be detected, the position correction amount and angle correction amount of rotary head 17 can be calculated accurately, such that even in a case in which the position or angle of rotary head 17 is deviated, the deviation can be corrected, and two suction nozzles 14 held by rotary head 17 can be exchanged simultaneously with two suction nozzles 14 of nozzle station 17. Further, component imaging camera 16 equipped on the component mounter can be used, and the position and angle of rotary head 17 can be detected using image processing.

On the other hand, nozzle station 17 is provided to be exchangeable within the movement range of rotary head 15 within the component mounter. As shown in FIG. 6, station reference marks 47 are provided at two opposite corners on an upper surface of nozzle station 17. Control device 41 of the component mounter functions as the station position and angle detecting means that detects the position (XY coordinates of a central point) and angle (0) of nozzle station 17 based on the positions of the two station reference marks 47 by imaging the two station reference marks 47 provided on nozzle station 17 from above using mark imaging camera 30 and performing image recognition of the positions of the two station reference marks 47. Accordingly, mark imaging camera 30 equipped on the component mounter for imaging board marks of circuit board 11 can be used, and the position and the angle of nozzle station 17 can be detected using image processing.

Figure 7:
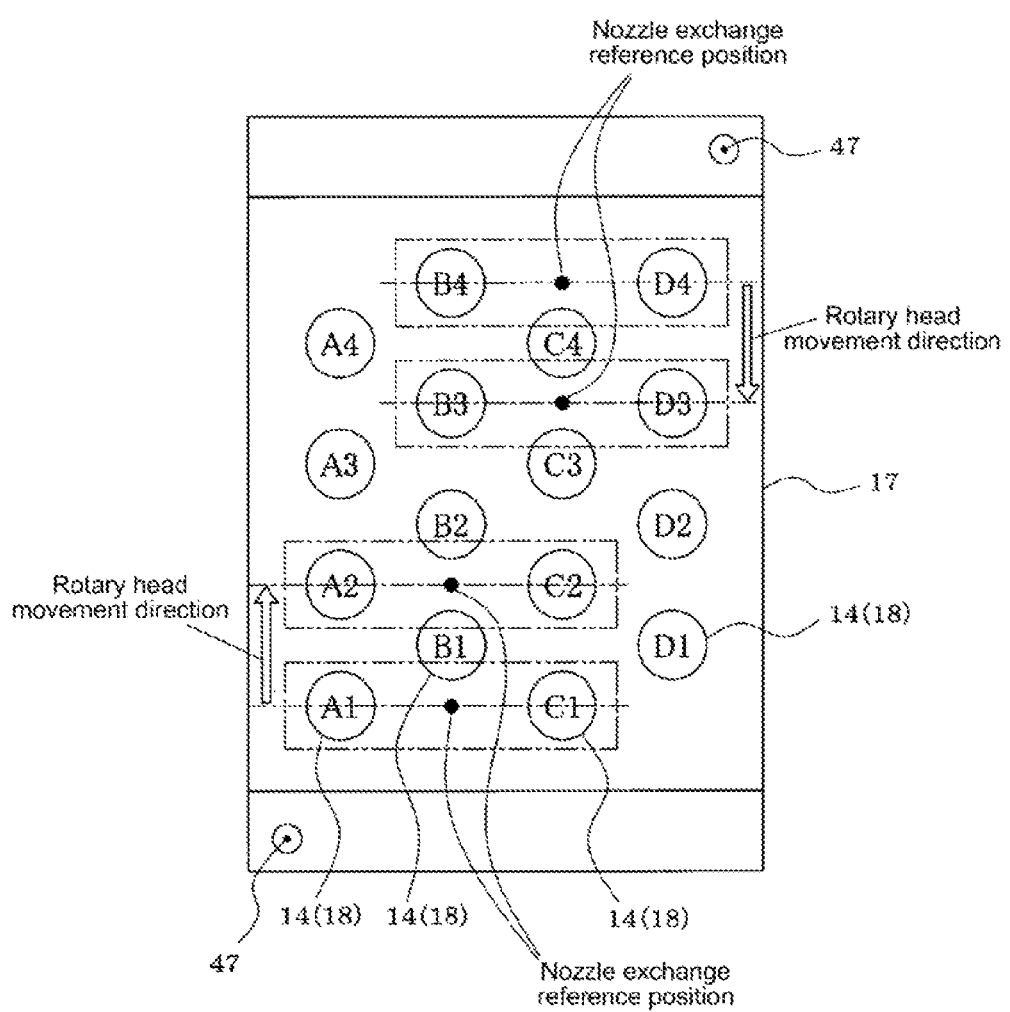
FIG. 7 is a plan view of the main components of the nozzle station illustrating an exchange order of suction nozzles in the nozzle station.

In the present embodiment, as shown in FIGS. 6 and 7, suction nozzles 14 (nozzle housing recesses 18) are arranged in multiple rows in nozzle station 17, and the interval between two suction nozzles 14 (nozzle housing recesses 18) of nozzle station 17 that are to be exchanged simultaneously is equal to the interval (nozzle pitch) between two nozzle holders 28 of rotary head 15 that are to be exchanged simultaneously.

Control device 41 of the component mounter, when moving rotary head 15 to the nozzle exchange area using head moving mechanism 20 and performing automatic exchange of suction nozzles 14, images the two station reference marks 47 of nozzle station 17 using mark imaging camera 30, recognizes the positions of the two station reference marks 47, and detects the position and angle of nozzle station 17, then, corrects the position of rotary head 15 using head moving mechanism 20 based on the detected position of nozzle station 17, corrects the rotation angle of rotary head 15 using head rotating mechanism 21 to be aligned with the detected angle of nozzle station 17, simultaneously lowers two suction nozzles 14 held by two nozzles holders 28 of rotary head 15 using the two Z-axis driving mechanisms 22, and simultaneously exchanges two suction nozzles 14 of nozzle station 17.

Here, the two suction nozzles 14 held by the two nozzle holders 28 of rotary head 15 are housed in two empty nozzle housing recesses 18 of nozzle station 17, and two suction nozzles 14 of nozzle station 17 are made to be held by two nozzle holders 28. Note that, nozzle removal operation of housing the two suction nozzles 14 held by the two nozzle holders 28 in the two empty nozzle housing recesses 18 of nozzle station 17 and nozzle holding operation of two suction nozzles 14 being made to be held by two nozzle holders 28 may be performed alternately, or, nozzle removal operation may be repeated sequentially such that all the suction nozzles 14 to be exchanged are removed from rotary head 15 and then nozzle holding operation may be repeated sequentially.

Further, in the present embodiment, to correct position deviation and angle deviation of rotary head 15 during automatic exchange of suction nozzles 14, control device 41 of the component mounter performs automatic exchange of two suction nozzles 14 after calculating the position correction amount and the angle correction amount of rotary head 15 based on detection values of the position and angle of rotary head 15 obtained by detecting the position and the angle of rotary head 15 based on the positions of the four head reference marks 46 obtained by imaging the four head reference marks 46 on the lower surface of rotary head 15 using component imaging camera 16 and performing image recognition of the four head reference marks 46.

Also, as shown in FIG. 6, provided on an upper surface of flange section 14a of suction nozzle 14 is ID code label 48 (nozzle ID memory section) on which is recorded identification information of the suction nozzle 14 (hereinafter also referred to as "nozzle ID") in the form of a barcode or 2D code. Control device 41 of the component mounter functions as the nozzle ID reading means that reads the nozzle ID of suction nozzles 14 by, before performing automatic exchange of suction nozzles 14 after moving rotary head 15 to the nozzle exchange area using head moving mechanism 20, imaging nozzle ID code label 48 of each suction nozzle 14 arranged in nozzle station 17 using mark imaging camera 30 and performing image processing.

Further, in the present embodiment, control device 41 of the component mounter, in a case of determining that the arrangement order of suction nozzles 14 in nozzle station 17 is different to the exchange order based on the nozzle IDs read from nozzle ID code labels 48 of each suction nozzle 14 arranged in nozzle station 17, switches suction nozzles 14 using exchange operation of suction nozzles 14 such that the arrangement order of suction nozzles 14 in nozzle station 17 matches the exchange order. Here, operation is repeated such that, among suction nozzles 14 arranged in nozzle station 17, a suction nozzle 14 different to the exchange order is made to be held by a nozzle holder 28 of rotary head 15, and is switched to an empty nozzle housing recess of nozzle station 17, then, the suction nozzle of the correct exchange order is made to be held by the nozzle holder 28 of rotary head 15, and is replaced in the correct nozzle housing recess for the exchange order, such that switching of suction nozzles 14 of nozzle station 17 is performed so that the arrangement order of suction nozzles 14 matches the exchange order. Note that, depending on the arrangement order of suction nozzles in nozzle station 17, there are cases in which two suction nozzles 14 can be switched simultaneously, and cases in which two nozzle cannot be switched simultaneously, in which case switching of suction nozzles 14 can be performed one by one.

In the present embodiment, as shown in FIG. 7, suction nozzles 14 are arranged in nozzle station 17 such that a movement distance of rotary head 15 from a position of suction nozzles 14 exchanged simultaneously previously to a position of suction nozzles 14 exchanged simultaneously subsequently is minimized. By this, it is possible to shorten the exchange time for suction nozzles 14.

In the example of FIG. 7, a total of sixteen suction nozzles 14 are arranged in nozzles station 17 in four rows of four (A1 to A4, B1 to B4, C1 to C4, D1 to D4). In a case of holding a total of twenty suction nozzles 14 of nozzle station 17 on a total of 16 nozzle holders 28 of rotary head 15, first, for example, after simultaneously holding the first suction nozzle 14 of the first row (A1) and the first suction nozzle 14 of the third row (C1) in two nozzle holders 28, rotary head 15 is moved using head moving mechanism 20 by an arrangement pitch of suction nozzles 14 in the direction of the next exchange order, and rotary head 15 is rotated by head rotating mechanism 21 by the angle of the pitch of the interval between nozzle holders 28, the two nozzle holders 28 next in the order are positioned above the second suction nozzle 14 of the first row (A2) and the second suction nozzle 14 of the third row (C2), and these suction nozzles 14 (A2 and C2) are simultaneously held on nozzle holders 28. Subsequently, rotary head 15 is rotated by an angle of one pitch by head rotating mechanism 21 such that the two nozzle holders 28 next in order are positioned above the third suction nozzles 14 of the first and third rows (A3, C3), those two suction nozzles 14 (A3, C3) are simultaneously held by the two nozzle holders 28, then, rotary head 15 is rotated again by an angle of one pitch by head rotating mechanism 21 such that the nozzle holders 28 next in order are positioned above the fourth suction nozzles 14 of the first and third rows (A4, C4), and those two suction nozzles 14 (A4, C4) are simultaneously held by the nozzle holders 28.

When all the suction nozzles 14 of the first and third rows (A1 to A4, C1 to C4) are held by nozzle holders 28 of rotary head 15, holding operation is performed for suction nozzles 14 of the second and fourth rows (B1 to B4, D1 to D4). Holding operation for suction nozzles 14 of the second and fourth rows (B1 to B4, D1 to D4) starts from the suction nozzles 14 at the end (fourth) of the second and fourth rows (B4, D4) that are closest to the suction nozzles 14 at the end (fourth) of the first and third rows (A4, C4). Subsequently, rotary head 15 is moved by head moving mechanism 20 in the opposite direction by an arrangement pitch of suction nozzles 14 each time, such that the third suction nozzles 14 (B3, D3), the second suction nozzles 14 (B2, D2), and the first suction nozzles 14 (B1, D1) are simultaneously held by nozzle holders 28 in order.

Figure 8:
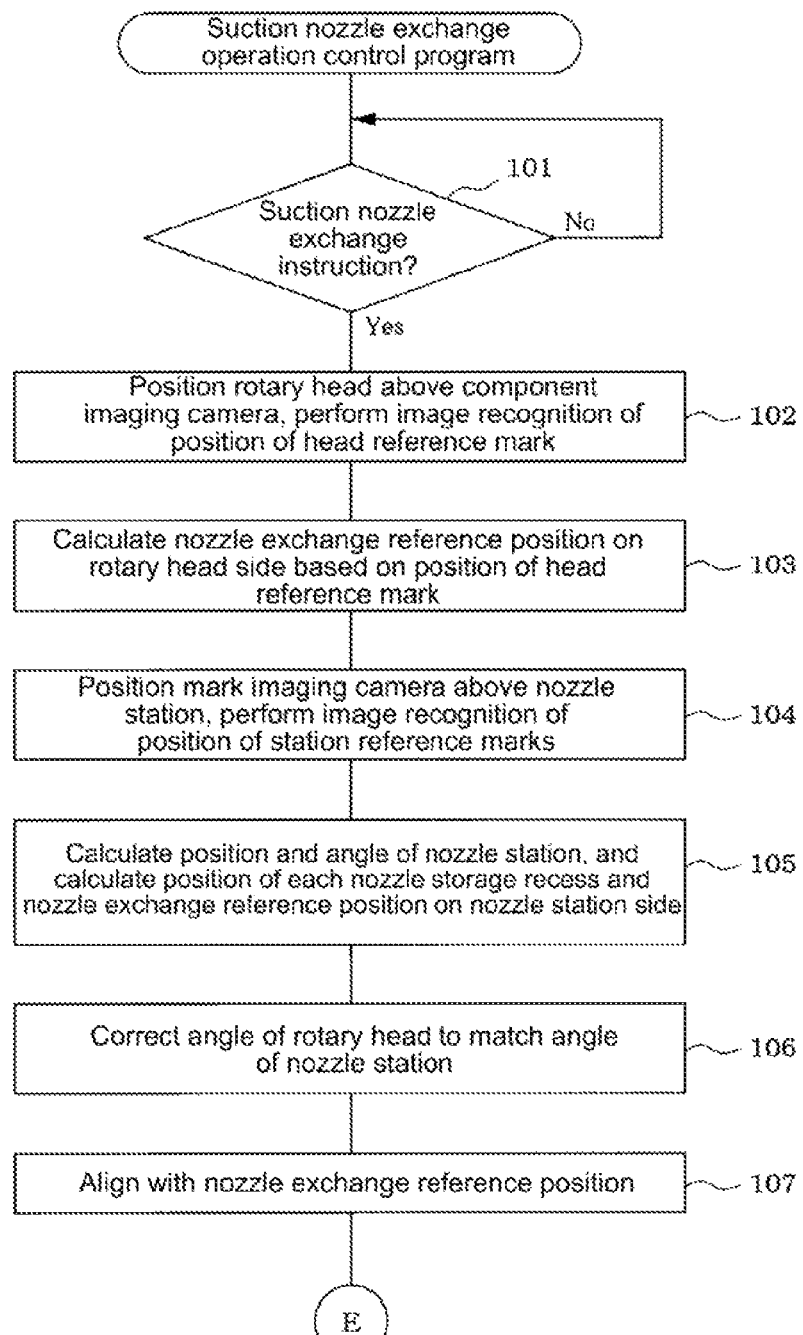
FIG. 8 is a flowchart showing the flow of processing of a first half of a suction nozzle exchange operation control program.

Exchange operation of suction nozzles 14 of the embodiment described above is performed by control device 41 as follows in accordance with the suction nozzle exchange operation control program of FIGS. 8 and 9. This program is performed repeatedly at a specified interval while power to control device 41 is turned on. When the program is started, first, in step 101, processing stands by until there is a suction nozzle exchange instruction. Then, when there is a suction nozzle exchange instruction, proceeding to step 102, rotary head 15 is positioned above component imaging camera 16 by head moving mechanism 20, the four reference marks 46 on the lower surface of rotary head 15 are imaged by component imaging camera 16 and image recognition is performed of the positions of the four head reference marks 46. Then, in step 103, based on the positions of the four head reference marks 46, the position and angle of rotary head 15 is detected, the position of the two nozzle holders 28 (suction nozzles 14) to be lowered simultaneously by the two Z-axis driving mechanisms 22 are calculated, and an intermediate position between the two nozzle holders 28 (suction nozzles 14) is calculated as a nozzle exchange reference position (refer to FIG. 10) on the rotary head 15 side.

Then, proceeding to step 104, mark imaging camera 30 is positioned above nozzle station 17 by head moving mechanism 20, the two station reference marks 47 on nozzle station 17 are imaged by mark imaging camera 30, and image recognition is performed of the positions of the two station reference marks 47. Then, proceeding to step 105, based on the recognized positions of the two station reference marks 47, the position and angle of nozzle station 17 are calculated, and the positions of each nozzle housing recess 18 of nozzle station 17 and a nozzle exchange reference position (refer to FIG. 7) on the nozzle station 17 side are calculated based on the position and angle of nozzle station 17. Here, the nozzle exchange reference position on the nozzle station 17 side is an intermediate position of the two suction nozzles 14 (two nozzle housing recesses 18) in nozzle station 17 to be exchanged simultaneously. Note that, the above processing of steps 104 to 105 may be performed before processing of steps 102 to 103.

Then, proceeding to step 106, a rotary head 15 angle correction amount is calculated based on the angle of nozzle station 17 and the angle of rotary head 15, and the angle of rotary head 15 is corrected by head rotating mechanism 21 to be aligned with the angle of nozzle station 17. Then, proceeding to step 107, rotary head 15 is moved to the nozzle exchange area by head moving mechanism 20, and the nozzle exchange reference position on the rotary head 15 side is aligned with the nozzle exchange reference position on the nozzle station 17 side.

Figure 9:
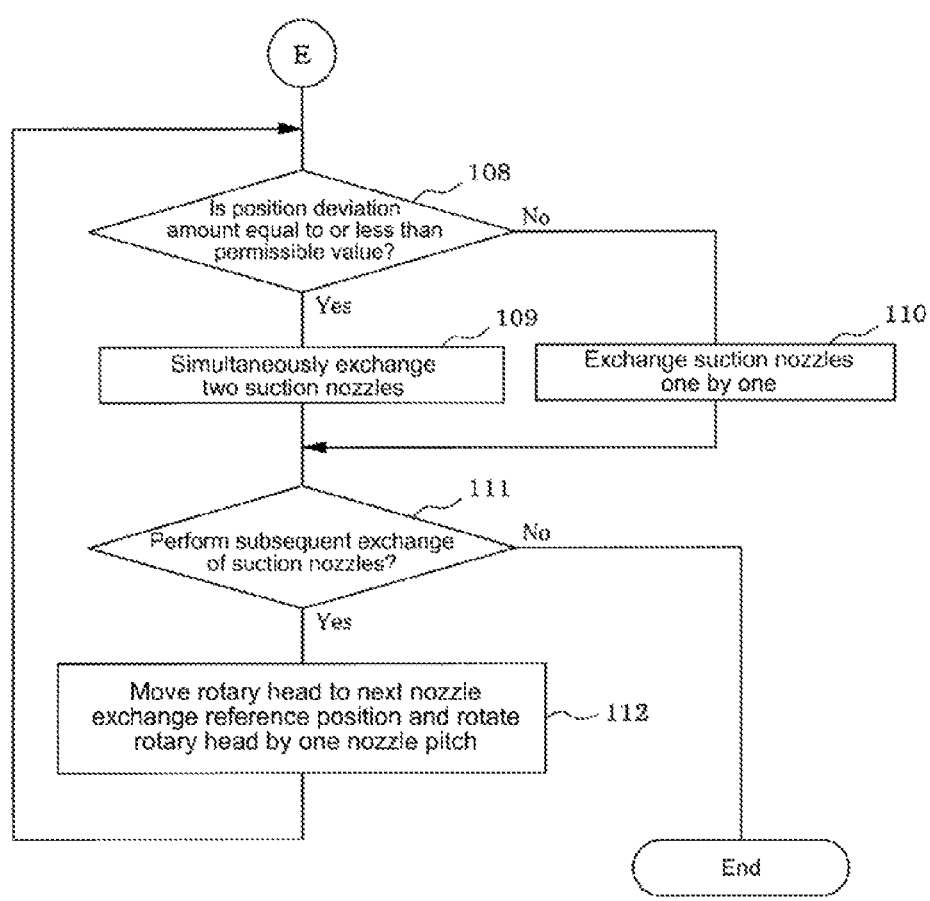
FIG. 9 is a flowchart showing the flow of processing of a second half of a suction nozzle exchange operation control program.
Figure 10:
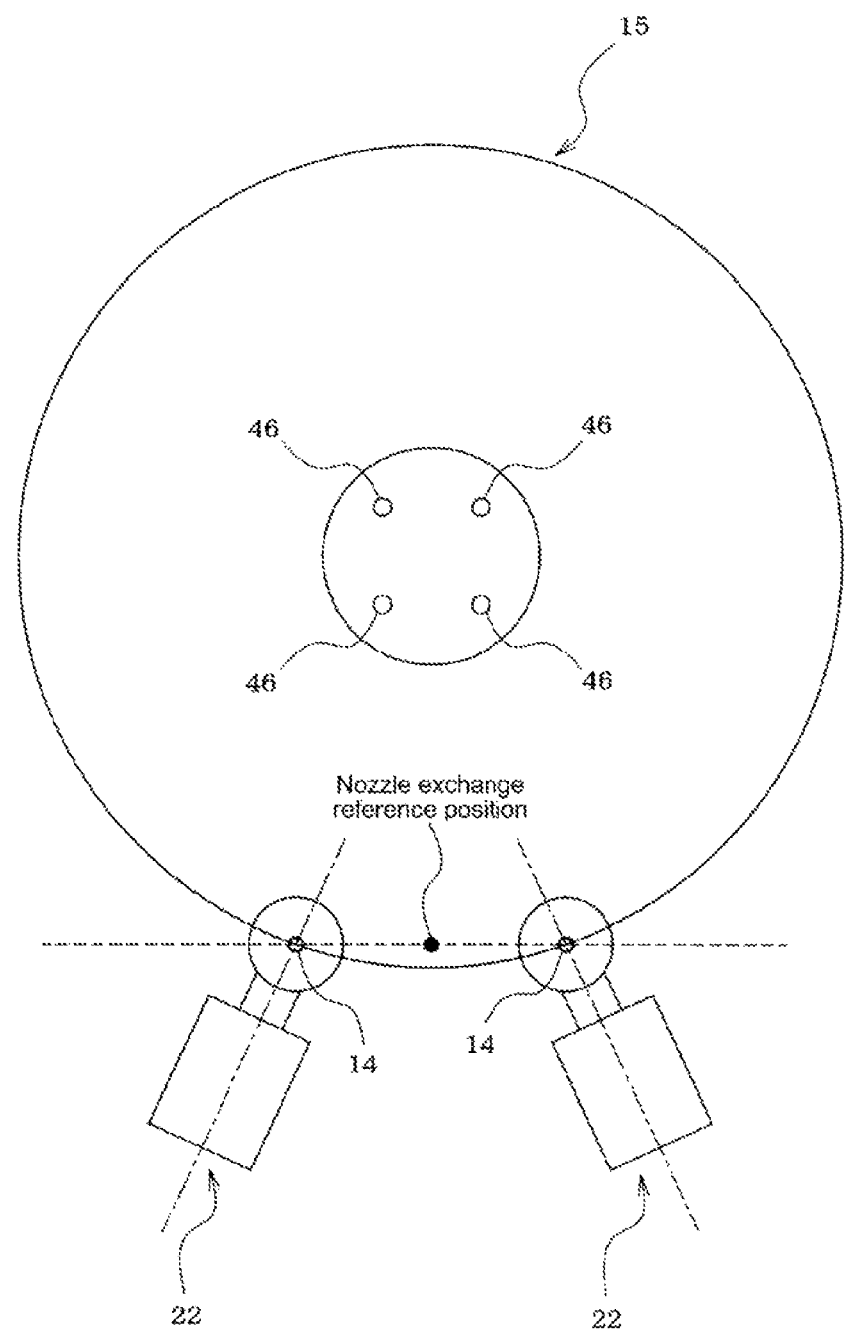
FIG. 10 is a bottom view of the rotary head illustrating a nozzle exchange reference position on the rotary head side.

Then, proceeding to step 108 of FIG. 9, it is determined whether the position deviation amount between the position of the two nozzle holders 28 of rotary head 15 to be lowered simultaneously and the position of the two suction nozzles 14 of nozzle station 17 is equal to or less than a permissible value for simultaneous exchange. If the determination result is that the position deviation amount is equal to or less than the permissible value, proceeding to step 109, the two nozzle holders 28 of rotary head 15 are lowered simultaneously by the two Z-axis driving mechanisms 22, such that the two suction nozzles 14 of nozzle station 17 are simultaneously held by the two nozzle holders 28.

In contrast, if it is determined in step 108 that the position deviation amount exceeds the permissible value, it is determined that simultaneous exchange is not possible, and, proceeding to step 110, after holding one of the suction nozzles 14 of nozzle station 17 by one of the nozzle holders 28 of the two nozzle holders 28, the other of the suction nozzles 14 is held by the other of the nozzle holders 28. That is, the suction nozzles 14 are held one by one.

Then, proceeding to step 111, it is determined whether to perform subsequent exchange of suction nozzles 14, and if it is determined to perform subsequent exchange of suction nozzles 14, proceeding to step 112, rotary head 15 is moved by head moving mechanism 20 to the next nozzle exchange reference position on the nozzle station 17 side, rotary head 15 is rotated by head rotating mechanism 21 by the angle of one pitch between nozzle holders 28, and the two nozzle holders 28 for the next simultaneous exchange are positioned at the two suction nozzles 14 for the next simultaneous exchange, then processing returns to step 108. Subsequently, the above processing is repeated, and each suction nozzle 14 of nozzle station 17 is sequentially held by the nozzle holders 28 of rotary head 15.

Then, when suction nozzles 14 are held by all the nozzle holders 28 of rotary head 15, in the above step 111, the determination is "No", and the program ends.

Note that, because work of changing the positions of suction nozzles 14 in nozzle station 17 is manual work performed by an operator, as in the present embodiment, having an exchangeable nozzle station 17 enables work of changing the positions of suction nozzles 14 in nozzle station 17 to be performed without time pressure in a spacious area outside of the component mounter while the component mounter continues to operate, and is convenient because preparation can be done for exchange of the next nozzle station 17. However, if nozzle station 17 is configured to be exchangeable, it is easier for the angle or position of nozzle station 17 set inside the component mounter to deviate.

Considering this point, in the present embodiment, because the position and angle of nozzle station 17 are detected and the position and angle of rotary head 15 are corrected in accordance with the detection results when performing simultaneous exchange of suction nozzles 14, even in a case in which nozzle station 17 is attached at an angle with a position deviation, it is possible to perform simultaneous exchange of two suction nozzles 14 held by rotary head 17 with two suction nozzles 14 in nozzle station 17.

Note that, with the present disclosure, nozzle station 17 may be configured not to be exchangeable, and even in this case it is possible to realize an object of the disclosure.

Also, in an embodiment above, nozzle ID code label 48 is provided on suction nozzle 14 as a nozzle ID memory section on which a nozzle ID is recorded, but an electronic tag (also known as an RF tag, IC tag, radio tag, or wireless tag) with the nozzle ID recorded may be provided, and a reader (nozzle ID reading means) to read the nozzle ID from the electronic tag may be provided on the component mounter side.

Otherwise, the present disclosure is not limited to the above embodiments, and it goes without saying that various changes may be made without departing from the scope, for example, the configuration may be such that three or more suction nozzles 14 may be exchanged simultaneously, the quantity of suction nozzles 14 (quantity of nozzle holders 28) held by rotary head 15 may be changed, the quantity of suction nozzles 14 arranged in nozzle station 17 may be changed, or the exchange order or arrangement pattern of suction nozzles 14 in nozzle station 17 may be changed.

REFERENCE SIGNS LIST

11: circuit board; 12: conveyor; 13: component supply device; 14: suction nozzle; 15: rotary head; 16: component imaging camera; 17: nozzle station; 18: nozzle housing recess; 20: head moving mechanism; 21: head rotating mechanism; 22: Z-axis driving mechanism; 23: nozzle rotating mechanism; 28: nozzle holder; 30: mark imaging camera; 41: control device (control means); 46: head reference mark; 47: station reference mark; 48: nozzle ID code label (nozzle ID recording section)

The invention claimed is:
1. A rotary head type component mounter, comprising:
  a rotary head configured to hold a specified quantity of suction nozzles in an exchangeable manner at a specified nozzle pitch in a circumferential direction;
  a nozzle station configured such that multiple suction nozzles are arranged to be exchanged with a suction nozzle held by the rotary head;
  a head rotating mechanism configured to revolve the specified quantity of suction nozzles in a rotation direction of the rotary head by rotating the rotary head;
  a head moving mechanism configured to move the rotary head in XY directions to and from a component pickup area at which component pickup operation is performed, a component mounting area at which compo- nent mounting operation is performed, and a nozzle exchange area at which exchange operation of suction nozzles is performed;

a Z-axis driving mechanism configured to drive raise and lower the suction nozzle in the component pickup area, the component mounting area, and the nozzle exchange area so as to perform component pickup, component mounting, and exchange of the suction nozzle;

a control means configured to perform control of the head rotating mechanism, the head moving mechanism, and the Z-axis driving mechanism;

wherein the Z-axis driving mechanism is configured to simultaneously lower multiple suction nozzles of the specified quantity of suction nozzles held by the rotary head, and the control means is configured to, when the head moving mechanism moves the rotary head to the nozzle exchange area for exchange of suction nozzles to be performed, alternately and repeatedly perform a nozzle removing operation of housing two of the suction nozzles held in two of the nozzle holders in two empty nozzle housing sections of the nozzle station, and a nozzle holding operation of holding two of the suction nozzles housed in the nozzle station on two of the nozzle holders.

* * * * *